(12) United States Patent
Shi et al.

(10) Patent No.: US 10,262,614 B2
(45) Date of Patent: Apr. 16, 2019

(54) SCAN DRIVING CIRCUIT, DRIVING CIRCUIT AND DISPLAY DEVICE

(71) Applicant: Shenzhen China Star Optoelectronics Technology Co., Ltd., Shenzhen, Guangdong (CN)

(72) Inventors: Longqiang Shi, Guangdong (CN); Congwei Liao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 132 days.

(21) Appl. No.: 15/326,952

(22) PCT Filed: Jan. 16, 2017

(86) PCT No.: PCT/CN2017/071247
§ 371 (c)(1),
(2) Date: Jan. 17, 2017

(87) PCT Pub. No.: WO2018/120322
PCT Pub. Date: Jul. 5, 2018

(65) Prior Publication Data
US 2018/0211624 A1    Jul. 26, 2018

(30) Foreign Application Priority Data
Dec. 30, 2016 (CN) .......................... 2016 1 1259128

(51) Int. Cl.
G09G 3/36 (2006.01)
(52) U.S. Cl.
CPC ... *G09G 3/3677* (2013.01); *G09G 2310/0289* (2013.01); *G09G 2310/06* (2013.01)

(58) Field of Classification Search
CPC ................... G09G 3/3677; G09G 2310/0286
See application file for complete search history.

(56) References Cited

U.S. PATENT DOCUMENTS

| | | | | |
|---|---|---|---|---|
| 2009/0189677 A1* | 7/2009 | Lee | ....................... | G09G 3/3677 327/427 |
| 2009/0304138 A1* | 12/2009 | Tsai | ....................... | G11C 19/28 377/79 |

(Continued)

FOREIGN PATENT DOCUMENTS

| CN | 106098016 A | 11/2016 |
|---|---|---|
| CN | 106128409 A | 11/2016 |
| KR | 20140101152 A | 8/2014 |

*Primary Examiner* — Kevin M Nguyen
(74) *Attorney, Agent, or Firm* — Andrew C. Cheng

(57) ABSTRACT

The present disclosure provides a scan driving circuit for driving an Nth-stage scanning line including: a pull-up control module for receiving a cascade signal of an upper stage and generating a scan level signal of the Nth-stage scanning line based on the cascade signal of the upper stage; a pull-up module for pulling down the scanning signal of the Nth-stage scanning line when the first clock signal is low according to the scan level signal and the first clock signal; the pull-up control module includes a first control unit and a second control unit, the control terminal of the second control unit inputs a second clock signal for controlling the scan level signal to become smaller when the second clock signal is at a high level. The present disclosure can prevent the waveform of the gate from appearing spikes, and thus the waveform of the gate is output normally.

15 Claims, 3 Drawing Sheets

(56) References Cited

U.S. PATENT DOCUMENTS

| | | | |
|---|---|---|---|
| 2010/0171728 A1* | 7/2010 | Han | G09G 3/3677 345/211 |
| 2011/0142192 A1* | 6/2011 | Lin | G09G 3/3677 377/77 |
| 2011/0234577 A1* | 9/2011 | Yang | G09G 3/3677 345/212 |
| 2014/0253424 A1 | 9/2014 | Yu et al. | |
| 2015/0187311 A1 | 7/2015 | Kuo | |
| 2016/0125824 A1 | 5/2016 | Dai | |
| 2016/0125830 A1 | 5/2016 | Xiao | |
| 2016/0140922 A1 | 5/2016 | Dai et al. | |
| 2016/0253975 A1 | 9/2016 | Yang et al. | |
| 2016/0351152 A1 | 12/2016 | Dai | |

\* cited by examiner

SCAN DRIVING CIRCUIT, DRIVING CIRCUIT AND DISPLAY DEVICE

FIELD OF THE DISCLOSURE

The present disclosure relates to a flat panel display technology field, and more particularly to a scan driving circuit, a driving circuit and a display device.

BACKGROUND OF THE DISCLOSURE

GOA (Gate Driver on Array) technology can help to create narrow or borderless display products, and reduce the external integrated circuit (IC) binding process is conducive to enhance productivity and reduce product costs, which has been widely used and research.

Current GOA circuits include cascaded GOA cells, with each GOA cell corresponding to a first scan line. The GOA unit mainly includes a pull-up part, a pull-up control part, a transfer part, a key pull-down part, a pull-down holding part, and a boast capacitor for raising the electric potential. As shown in FIG. 1, FIG. 1 is a circuit diagram of a GOA unit in the prior art, in FIG. 1, the pull-down control circuit is composed of a thin film transistor (TFT) T11, however, under the effect of this pull-down control unit, the waveform of the gate cannot be rapidly lowered in the presence of a large RC load of the gate line, resulting in the presence of a sharp peak, the waveform of one gate, as shown in FIG. 2, causes the waveform of the gate to be abnormal and cannot be outputted normally.

SUMMARY OF THE DISCLOSURE

It is an object of the present disclosure to provide a scan driving circuit, a driving circuit, and a display device for preventing a waveform of a gate from appearing sharp peaks because the waveform of the gate in the prior art cannot be rapidly lowered to cause a sharp peak, so that the waveform of the gate is normally outputted.

The present disclosure has been made to solve the above-mentioned problems by providing a driving circuit, wherein, the driving circuit includes a plurality of driving units connected in cascade, wherein the Nth-stage driving unit is used for driving operation of the Nth-stage scanning line of a display area, the Nth-stage driving unit includes: a pull-up control module for receiving a cascade signal of an upper stage and generating a scan level signal of the Nth-stage scanning line based on the cascade signal of the upper stage; a pull-up module for pulling down the scanning signal of the Nth-stage scanning line when the first clock signal is low according to the scan level signal and the first clock signal; wherein, the pull-up control module includes a first control unit and a second control unit, the input terminal and control terminal of the first control unit respectively input the cascade signal of the upper stage, the output terminal of the first control unit outputs the scan level signal; the control terminal of the second control unit inputs the second clock signal for controlling the scan level signal to become small when the second clock signal is high so that the scan signal of the Nth-stage scanning line is pulled low by the pull-up module when the first clock signal is low;

the first clock signal and the second clock signal are inverted signals;

the Nth-stage driving unit further includes a bootstrap capacitor for raising the voltage of the scanning signal of the Nth-stage scanning line; the bootstrap capacitor is connected at one end to the output terminal of the pull-up control module, and the other end of the bootstrap capacitor is inputted with the scanning signal of the Nth-stage scanning line.

Wherein, the first control unit includes a first switch tube and a second switch tube, wherein, the input terminal of the first switch tube inputs the cascade signal of the upper stage, the control terminal of the first switch tube and the second switch tube respectively inputs the cascade signal of the upper stage, the output terminal of the first switch tube is connected with the input terminal of the second switch tube, the output terminal of the second switch tube outputs the scan level signal.

Wherein, the second control unit includes a third switch tube and a fourth switch tube, wherein, the input terminal of the third switch tube is connected with the output terminal of the first switch tube, the control terminal of the third switch tube inputs the second clock signal, the output terminal of the third switch tube outputs the scan level signal; the input terminal of the fourth switch tube is connected with the output terminal of the first switch tube, the control terminal of the fourth switch tube inputs the scan level signal, the output terminal of the fourth switch tube outputs the scanning signal of the Nth-stage scanning line.

Wherein, the cascade signal of the upper stage is a cascade signal of the N-4 stage.

Wherein, the pull-up module includes a fifth switch tube and a sixth switch tube, wherein, the control terminal of the fifth switch tube is connected with the output terminal of the pull-up control module, the input terminal of the fifth switch tube inputs the first clock signal, the output terminal of the fifth switch tube outputs the cascade signal of the Nth stage; the control terminal of the sixth switch tube is connected with the output terminal of the pull-up control module, the input terminal of the sixth switch tube inputs the first clock signal, the output terminal of the sixth switch tube outputs the scanning signal of the Nth-stage scanning line.

Wherein, the N-1 stage, the N-2 stage, the N-3 stage, and the N-4 stage driving units are provided for driving the N-1 stage, N-2 stage, N-3 stage and N-4 stage scanning line, the corresponding pull-up control module receives the start trigger signal.

Another aspect of the present disclosure to solve the above problems is to provide a scan driving circuit for driving an Nth-stage scanning line, wherein, the scan driving circuit includes: a pull-up control module for receiving a cascade signal of an upper stage and generating a scan level signal of the Nth-stage scanning line based on the cascade signal of the upper stage; a pull-up module for pulling down the scanning signal of the Nth-stage scanning line when the first clock signal is low according to the scan level signal and the first clock signal; wherein, the pull-up control module includes a first control unit and a second control unit, the input terminal and control terminal of the first control unit respectively input the cascade signals of the upper stage, the output terminal of the first control unit outputs the scan level signal; the control terminal of the second control unit inputs a second clock signal for controlling the scan level signal to become smaller when the second clock signal is at a high level so that the scan signal of the Nth scanning line pulled low by the pull-up module when the first clock signal is at a low level.

Wherein, the first clock signal and the second clock signal are inverted signals.

Wherein, the first control unit includes a first switch tube and a second switch tube, wherein, the input terminal of the first switch tube inputs the cascade signal of the upper stage, the control terminal of the first switch tube and the second switch tube respectively input the cascade signals of the upper stage, the output terminal of the first switch tube is connected with the input terminal of the second switch tube, the output terminal of the second switch tube outputs the scan level signal.

Wherein, the second control unit includes a third switch tube and a fourth switch tube, wherein, the input terminal of the third switch tube is connected with the output terminal of the first switch tube, the control terminal of the third switch tube inputs the second clock signal, the output terminal of the third switch tube outputs the scan level signal; the input terminal of the fourth switch tube is connected with the output terminal of the first switch tube, the control terminal of the fourth switch tube inputs the scan level signal, the output terminal of the fourth switch tube outputs the scanning signal of the Nth-stage scanning line.

Wherein, the cascade signal of the upper stage is a cascade signal of the N-4 stage.

Wherein, the pull-up module includes a fifth switch tube and a sixth switch tube, wherein, the control terminal of the fifth switch tube is connected with the output terminal of the pull-up control module, the input terminal of the fifth switch tube inputs the first clock signal, the output terminal of the fifth switch tube outputs the cascade signal of the Nth stage; the control terminal of the sixth switch tube is connected with the output terminal of the pull-up control module, the input terminal of the sixth switch tube inputs the first clock signal, the output terminal of the sixth switch tube outputs the scanning signal of the Nth-stage scanning line.

Wherein, the circuit further includes: a bootstrap capacitor for raising the voltage of the scanning signal of the Nth-stage scanning line; the bootstrap capacitor is connected at one end to the output terminal of the pull-up control module, and the other end of the bootstrap capacitor is inputted with the scanning signal of the Nth-stage scanning line.

wherein, the circuit further includes: a pull-down module for pulling down the scan level signal of the Nth-stage scanning line based on the cascade signal of the lower level; a pull-down holding module for holding a low level of the scan level signal of the Nth-stage scanning line; a constant voltage source for providing a pull-down low level.

According to another aspect of the present disclosure, there is provided a driving circuit including a cascade of a plurality of driving units, wherein an Nth stage driving unit is used for driving operation of an Nth scan line of a display area, and the Nth stage driving units is the scan driving circuit.

The other aspect of the present disclosure to solve the above-described problems is to provide a display device including the above-described driving circuit.

The disclosure has the advantages that the scanning signal is prevented from spike and the waveform of the gate is outputted normally.

BRIEF DESCRIPTION OF THE DRAWINGS

The disclosure will now be further described in conjunction with the accompanying drawings and embodiments, in the drawings.

DETAILED DESCRIPTION OF PREFERRED EMBODIMENTS

In order to enable those skilled in the art to better understand the technical solution of the present disclosure, the technical solution of the present disclosure will be described in further detail with reference to the accompanying drawings and detailed description.

Figure 1:
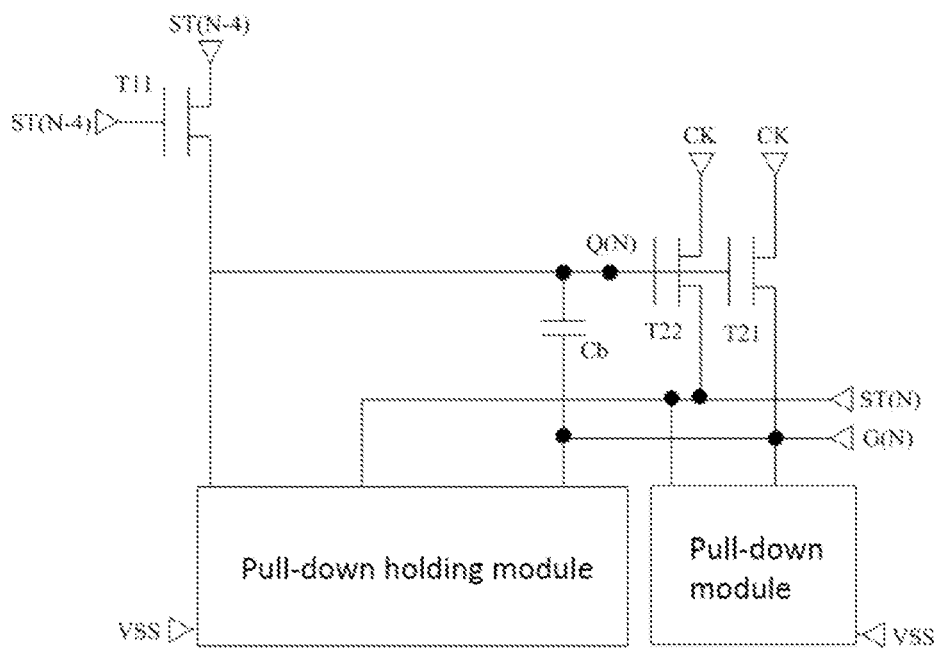
FIG. 1 is a circuit diagram of a GOA unit of the prior art.
Figure 2:
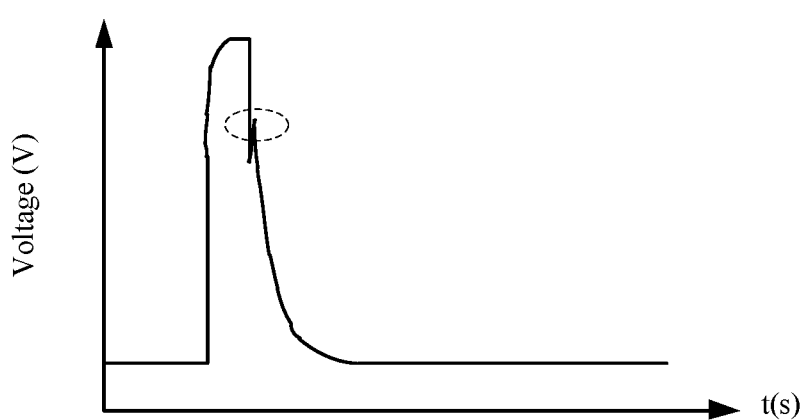
FIG. 2 is a signal diagram of a scan signal of one scan line of the GOA unit.
Figure 3:
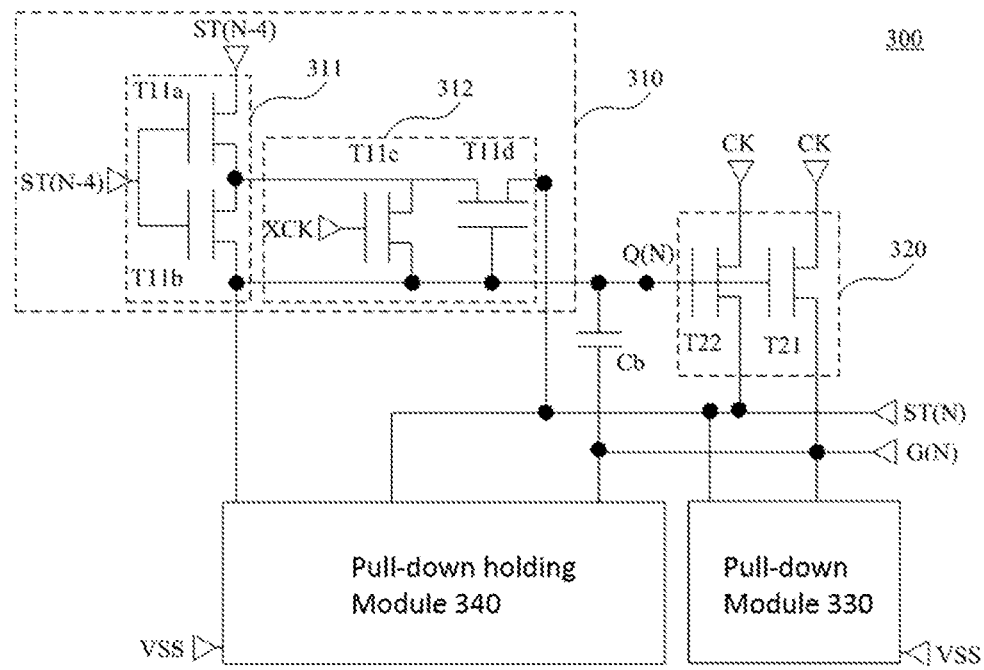
FIG. 3 is a schematic diagram of an embodiment of a scan driving circuit of the present disclosure.

As shown in FIG. 3, FIG. 3 is a schematic diagram of an embodiment of a scan driving circuit of the present disclosure, the scan driving circuit 300 is used to drive operation of the Nth-stage scanning line, can be applied to the application of liquid crystal display. The scan driving circuit 300 includes a pull-up control module 310 and a pull-up module 320.

The pull-up control module 310 is used to receive the cascade signal of the upper stage, and generate the scan level signal Q(N) of the Nth-stage scanning line based on the cascade signal of the upper stage;

the pull-up module 320 is used to pull down the scanning signal G(N) of the Nth-stage scanning line when the first clock signal CK is low level based on the scan level signal Q(N) and the first clock signal CK.

Wherein, the pull-up control module 310 includes a first control unit 311 and a second control unit 312, the input terminal and control terminal of the first control unit 311 respectively input the cascade signal of the upper stage, the output terminal of the first control unit 311 outputs the scan level signal Q(N); the control terminal of the second control unit 312 inputs the second clock signal XCK for controlling the scan level signal Q(N) become small when the second clock signal XCK is high level so that the scan signal G(N) of the Nth-stage scanning line is pulled low by the pull-up module 320 when the first clock signal CK is low.

In the present embodiment, the pull-up control module 310 controls the output of the scan level signal Q(N) when the inputted second clock signal XCK is at high level to become small, and then causes the pull-up module 320 to pull up the scanning signal G (N) of the N-th stage scanning line based on the scan level signal Q (N) and the first clock signal CK, the scanning signal G (N) of the N-th scanning line is pulled down when the inputted first clock signal CK is at the low level to prevent the scanning signal from being spiked, and the waveform of the gate is normally outputted.

Further, in the present embodiment, the first clock signal CK and the second clock signal XCK are inverted signals. When the first clock signal CK is at the low level, the second clock signal XCK is at the high level, and similarly, when the second clock signal XCK is at the low level, the first clock signal CK is at the high level.

Specifically, the first control unit 311 includes a first switch tube T11a and a second switch tube T11b, in which the cascade signal of the upper stage is input to the input terminal of the first switch tube T11a, the control terminal of the first switch tube T11a and the second switch tube T11b respectively inputs the cascade signal of the upper stage. The output terminal of the first switch tube T11a is connected with the input terminal of the second switch tube T11b, and the output terminal of the second switch tube T11b outputs a scan level signal Q (N).

The second control unit 312 includes a third switch tube T11c and a fourth switch tube T11d, in which the input terminal of the third switch tube T11c is connected with the output terminal of the first switch tube T11a, the control terminal of the third switch tube T11c inputs the second clock signal XCK and the output terminal of the third switch tube T11c outputs the scan level signal Q (N); the input terminal of the fourth switch tube T11d is connected with the output terminal of the first switch tube T11a, the control terminal of the fourth switch tube T11d inputs the scan level signal Q(N), the output terminal of the fourth switch tube T11d outputs the scanning signal G(N) of the Nth-stage scanning line. It can be seen that the fourth switch tube T11d is connected in series with the first switch tube T11a, the third switch tube T11c is connected in series with the first switch tube T11a, the equivalent resistance of the second control unit 312 is relatively large, to achieve the purpose of controlling the scan level signal Q (N) to become small when the second clock signal XCK is at a high level. Further, in making the second control unit 312, the third switch tube T11c and the fourth switch tube T11d are small in size, so that the equivalent resistance of the third switch tube T11c and the fourth switch tube T11d is large, so that the equivalent resistance of the second control unit 312 becomes larger and further the purpose of controlling the decrease of the scan level signal Q (N) when the second clock signal XCK is high is attained.

Further, the cascade signal of the upper stage is the cascade signal ST (N-4) of the N-4 th stage. Note that the cascade signal ST (N-4) of the N-4th stage is used as the cascade signal of the upper stage in the scan driving circuit 300, at this time, the input terminal of the first switch tube T11a inputs the cascade signal ST(N-4) of the N-4th stage, the control terminal of the first switch tube T11a and the second switch tube T11b respectively input the cascade signal of the N-4th stage ST(N-4), And in the preceding four stages of the scan driving circuit, the N-1 stage, the N-2 stage, the N-3 stage and the N-4 stage scan driving circuit are provided for driving the N-1 stage, N-2 stage, N-3 stage and N-4 stage scanning line, in its pull-up control module 310, the input terminal and control terminal of the first switch tube T11a and the control terminal of the second switch tube T11b respectively input the start trigger signal STV, the start trigger signal STV is high-frequency AC signal, there is one pulse per frame.

Further, continuing with FIG. 3, the pull-up module 320 includes a fifth switch tube T22 and a sixth switch tube T21, wherein, the control terminal of the fifth switch tube T22 is connected with the output terminal of the pull-up control module 310, the input terminal of the fifth switch tube T22 inputs the first clock signal CK, the output terminal of the fifth switch tube T22 outputs the cascade signal of the Nth-stage; the control terminal of the sixth switch tube T21 is connected with the pull-up control module 310, the input terminal of the sixth switch tube T21 inputs the first clock signal CK, the output terminal of the sixth switch tube T21 outputs the scanning signal of the Nth-stage scanning line G(N).

It should be noted that the first switch tube T11a, the second switch tube T11b, the third switch tube T11c, the fourth switch tube T11d, the fifth switch tube T22, and the sixth switch tube T21 of the present embodiment may be a thin film transistor, which is a field effect transistor. Accordingly, the input terminal is the source, the control terminal is the gate, and the output terminal is the drain, which will be understood by those skilled in the art and will not be described in detail herein. In addition, the first switch tube T11a, the second switch tube T11b, the third switch tube T11c, the fourth switch tube T11d, the fifth switch tube T22, and the sixth switch tube T21 of the present embodiment can be made of indium gallium zinc oxide, of course, other materials, such as amorphous silicon, can also be made within the scope of those skilled in the art. The low level and the high level of the present embodiment are not particularly limited to the specific level of the level.

Further, as shown in FIG. 3, the scan driving circuit 300 further includes a bootstrap capacitor Cb, the bootstrap capacitor Cb is used to raise the voltage of the scanning signal G(N) of the Nth-stage scanning line; one end of the bootstrap capacitor Cb is connected with the pull-up control module 310, the other end of the bootstrap capacitor Cb inputs the scanning signal G(N) of the Nth-stage scanning line.

Further, as shown in FIG. 3, the scan driving circuit 300 further includes a pull-down module 330, a pull-down holding module 340 and a constant voltage source VSS.

The pull-down module 330 for pulling down the scan level signal Q(N) of the Nth-stage scanning line based on the cascade signal of the lower level;

the pull-down holding module 340 for holding a low level of the scan level signal of the Nth-stage scanning line;

the constant voltage source VSS for providing a pull-down low level.

Note that, in this embodiment, the pull-down module 330 and the pull-down holding module 340 are not limited to the present disclosure, and therefore, the present disclosure is not limited to those skilled in the art.

The operation of the above-described scan driving circuit will be described in detail with reference to the scan driving circuit of the 32nd stage.

In order to facilitate the following description, the signals involved in the 32nd stage scan driving circuit will be described first. Since the 32-stage scan driving circuit is used as an example, the 32-th scanning line is driven by the scanning signal G (32), accordingly, the input terminal and control terminal of the first switch tube T11a of the pull-up control module and the control terminal of the second switch tube T11b inputs the cascade signal of the N-4th stage ST(N-4), at this time, the cascade signal inputted by the input terminal and control terminal of the first switch tube T11a and the control terminal of the second switch tube T11b is cascade signal of the 28th stage ST(28). At the same time, accordingly, in the 32nd stage scan driving circuit, the first clock signal CK and the second clock signal XCK are used as the opposite signals.

Figure 4:
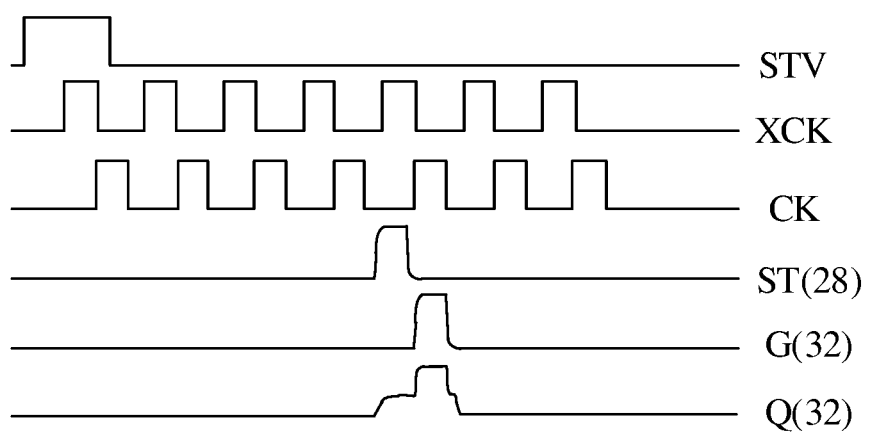
FIG. 4 is a timing diagram of a 32-stage scan driving circuit of the above embodiment of the present disclosure.

As shown in FIG. 3 and FIG. 4, As shown in FIGS. 3 and 4, when the cascade signal ST (28) of the twenty-eighth stage is high, the first switch tube T11a and the second switch tube T11b are opened, and at this time, the second switch tube T11b outputs a high level, and the second switch tube T11b outputted is the scan level signal Q(32), the high level of the cascade signal of the 28th stage ST (28) is propagated to the scan level signal Q (32), That is, the scan level signal Q (32) is at high level, and at the same time, the sixth switch tube T21 is turned on and the first clock signal CK is at the low level, the scanning signal G(32) is at the low level.

Subsequently, the cascade signal ST (28) of the 28th stage is low level, the first switch tube T11a and the second switch tube T11b are turned off, and at this time, the first clock signal CK is at high level, the scanning signal G (32) is at a high level, and the scan level signal Q (32) is raised to a higher level by the coupling effect of the bootstrap capacitor Cb.

Subsequently, the second clock signal XCK is at the high level, and at this time, since the first clock signal CK and the second clock signal CK are opposite signals, the first clock signal CK is at low level, the high-level scanning level signal Q (32) is pulled low by the third switch tube T11c and the fourth switch tube T11d, and the sixth switch tube T21 is not completely closed at this time, further, the low level of the first clock signal CK shifts to the scanning signal G (32), that is, the scanning signal G (32) is rapidly pulled low to the low level, it is realized that the scanning signal G (32) is quickly pulled low after the first clock signal CK is pulled high to prevent the waveform of the scanning signal G (32) from being spiked and outputted normally. It should be noted that it can be seen from the figure that the fourth switch tube T11d is connected in series with the first switch tube T11a, the third switch tube T11c is connected in series with the first switch tube T11a, the equivalent resistance of the second control unit 312 is relatively large, further, since the third switch tube T11c and the fourth switch tube T11d are small in size, the resistance thereof is large, further, the equivalent resistance of the pull-up control module 310 is large, and the pull-up control module 310 outputs the scan-level signal Q (32), so that the scan-level signal Q (32) decreased slowly, it can be said that, during the first preset time, the level is lowered to a certain level and lowered to the low level in the second preset time so as to realize the high level of the scan level signal Q (32), the sixth switch T21 is not fully closed, and the scan signal G (32) is pulled low quickly when the first clock signal CK is at low level.

Figure 5:
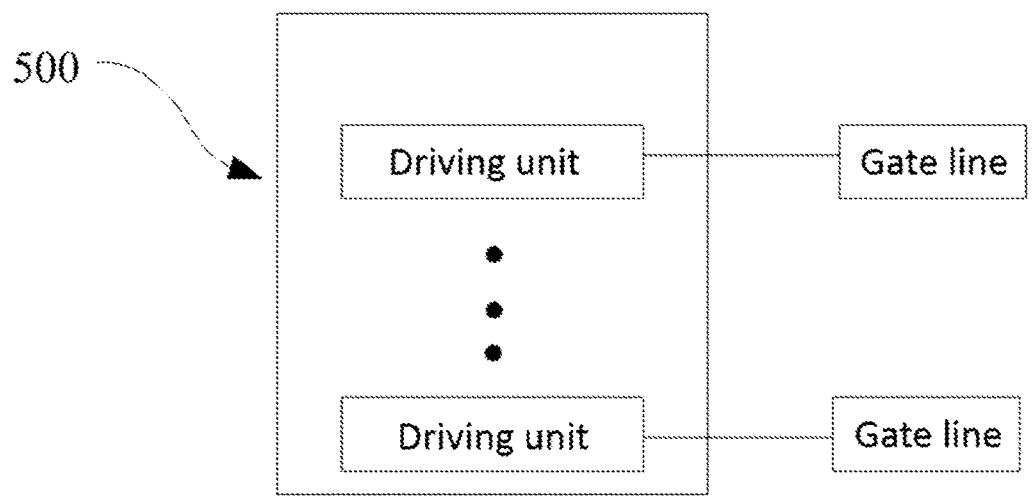
FIG. 5 is a schematic diagram of an embodiment of the driving circuit of the present disclosure.

As shown in FIG. 5, FIG. 5 is a schematic diagram of an embodiment of the driving circuit of the present disclosure, the driving circuit is used to liquid crystal display. The driving circuit being integrated on the array substrate for driving operation of the scanning lines of the display area, including a plurality of cascaded driving units, wherein, the Nth stage driving units is used for driving the Nth stage scanning line, and the Nth stage driving units is the scan driving circuit in the above embodiment, and will not be described in detail within the scope of those skilled in the art.

It should be noted that, in the driving circuit, the Nth stage driving unit uses the cascade signal of the N-4th stage ST(N-4), in the driving unit of the preceding four stages, the N-1 stage, N-2 stage, N-3 stage and N-4 stage driving units respectively drive the N-1 stage, N-2 stage, N-3 stage and N-4 stage scanning line, the pull-up control module uses the start trigger signal STV, which is a high-frequency AC signal, one pulse per frame, that is, the corresponding input terminal and control terminal of the first switch tube T11a and the control terminal of the second switch tube T11b respectively input the start trigger signal STV.

Figure 6:
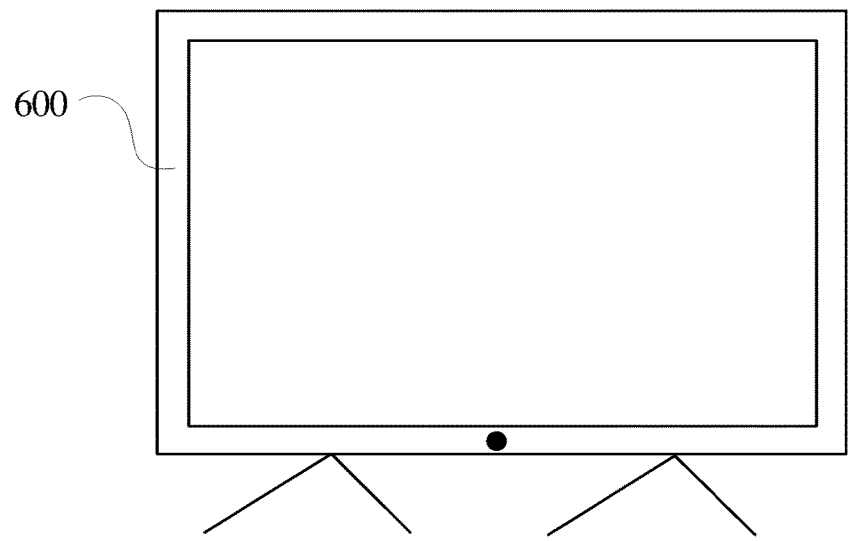
FIG. 6 is a schematic diagram of an embodiment of the display device of the present disclosure.

As shown in FIG. 6, FIG. 6 is a schematic diagram of an embodiment of the display device of the present disclosure, the display device includes a case 600 and a driving circuit in the above-described embodiment arranged in the case 600 (not shown). The driving circuit is integrated on the array substrate, and the technical features of the driving circuit are described in detail in the above embodiments. Other technical features of the display device are within the scope of those skilled in the art and will not be described here.

The above are only embodiments of the present disclosure is not patented and therefore limit the scope of the present disclosure, the use of any content of the present specification and drawings made equivalent or equivalent structural transformation process, either directly or indirectly in other relevant technical fields are included in the same way the scope of patent protection of the present disclosure.

What is claimed is:

1. A driving circuit wherein, the driving circuit comprises a plurality of driving units connected in cascade, wherein a Nth-stage driving unit is used for driving operation of a Nth-stage scanning line of a display area, the Nth-stage driving unit comprises:
   a pull-up control module for receiving a cascade signal of an upper stage and generating a scan level signal of the Nth-stage scanning line based on the cascade signal of the upper stage;
   a pull-up module for pulling down the scanning signal of the Nth-stage scanning line when a first clock signal is low level according to a scan level signal and the first clock signal;
   wherein, the pull-up control module comprises a first control unit and a second control unit, a input terminal and control terminal of the first control unit respectively input the cascade signal of the upper stage, a output terminal of the first control unit outputs the scan level signal; the control terminal of the second control unit inputs a second clock signal for controlling the scan level signal to become small when the second clock signal is high so that the scan signal of the Nth-stage scanning line is pulled low by the pull-up module when the first clock signal is low level;
   the first clock signal and the second clock signal are inverted signals;
   the Nth-stage driving unit further comprises a bootstrap capacitor for raising the voltage of the scanning signal of the Nth-stage scanning line; the bootstrap capacitor is connected at one end to the output terminal of the pull-up control module, and the other end of the bootstrap capacitor is inputted with the scanning signal of the Nth-stage scanning line;
   wherein N is an integer greater than 0.

2. The circuit according to claim 1, wherein, the first control unit comprises a first switch tube and a second switch tube, wherein, the input terminal of the first switch tube inputs the cascade signal of the upper stage, the control terminal of the first switch tube and the second switch tube respectively inputs the cascade signal of the upper stage, the output terminal of the first switch tube is connected with the input terminal of the second switch tube, the output terminal of the second switch tube outputs the scan level signal.

3. The circuit according to claim 2, wherein, the second control unit comprises a third switch tube and a fourth switch tube, wherein, the input terminal of the third switch tube is connected with the output terminal of the first switch tube, the control terminal of the third switch tube inputs the second clock signal, the output terminal of the third switch tube outputs the scan level signal; the input terminal of the fourth switch tube is connected with the output terminal of the first switch tube, the control terminal of the fourth switch tube inputs the scan level signal, the output terminal of the fourth switch tube outputs the scanning signal of the Nth-stage scanning line.

4. The circuit according to claim 3, wherein, the cascade signal of the upper stage is a cascade signal of the N-4 stage, wherein N is an integer greater than 4.

5. The circuit according to claim 1, wherein, the pull-up module comprises a fifth switch tube and a sixth switch tube, wherein, the control terminal of the fifth switch tube is connected with the output terminal of the pull-up control module, the input terminal of the fifth switch tube inputs the first clock signal, the output terminal of the fifth switch tube outputs the cascade signal of the Nth stage; the control terminal of the sixth switch tube is connected with the output terminal of the pull-up control module, the input terminal of the sixth switch tube inputs the first clock signal, the output terminal of the sixth switch tube outputs the scanning signal of the Nth-stage scanning line.

6. The circuit according to claim 1, wherein, the N-1 stage, the N-2 stage, the N-3 stage, and the N-4 stage driving units are provided for driving the N-1 stage, N-2 stage, N-3 stage and N-4 stage scanning line, the corresponding pull-up control module receives the start trigger signal, wherein N is an integer greater than 4.

7. A scan driving circuit for driving an Nth-stage scanning line, wherein, the scan driving circuit comprises:
   a pull-up control module for receiving a cascade signal of an upper stage and generating a scan level signal of the Nth-stage scanning line based on the cascade signal of the upper stage;
   a pull-up module for pulling down a scanning signal of the Nth-stage scanning line when a first clock signal is low level according to a scan level signal and the first clock signal;
   wherein, the pull-up control module comprises a first control unit and a second control unit, a input terminal and control terminal of the first control unit respectively input the cascade signals of the upper stage, a output terminal of the first control unit outputs the scan level signal; the control terminal of the second control unit inputs a second clock signal for controlling the scan level signal to become smaller when the second clock signal is at a high level so that the scan signal of the Nth scanning line pulled low by the pull-up module when the first clock signal is at a low level;
   wherein N is an integer greater than 0.

8. The circuit according to claim 7, wherein, the first clock signal and the second clock signal are inverted signals.

9. The circuit according to claim 8, wherein, the first control unit comprises a first switch tube and a second switch tube, wherein, the input terminal of the first switch tube inputs the cascade signal of the upper stage, the control terminal of the first switch tube and the second switch tube respectively input the cascade signals of the upper stage, the output terminal of the first switch tube is connected with the input terminal of the second switch tube, the output terminal of the second switch tube outputs the scan level signal.

10. The circuit according to claim 9, wherein, the second control unit comprises a third switch tube and a fourth switch tube, wherein, the input terminal of the third switch tube is connected with the output terminal of the first switch tube, the control terminal of the third switch tube inputs the second clock signal, the output terminal of the third switch tube outputs the scan level signal; the input terminal of the fourth switch tube is connected with the output terminal of the first switch tube, the control terminal of the fourth switch tube inputs the scan level signal, the output terminal of the fourth switch tube outputs the scanning signal of the Nth-stage scanning line.

11. The circuit according to claim 10, wherein, the cascade signal of the upper stage is a cascade signal of the N-4 stage, wherein N is an integer greater than 4.

12. The circuit according to claim 8, wherein, the pull-up module comprises a fifth switch tube and a sixth switch tube, wherein, the control terminal of the fifth switch tube is connected with the output terminal of the pull-up control module, the input terminal of the fifth switch tube inputs the first clock signal, the output terminal of the fifth switch tube outputs the cascade signal of the Nth stage; the control terminal of the sixth switch tube is connected with the output terminal of the pull-up control module, the input terminal of the sixth switch tube inputs the first clock signal, the output terminal of the sixth switch tube outputs the scanning signal of the Nth-stage scanning line.

13. The circuit according to claim 7, wherein, the circuit further comprises:
   a bootstrap capacitor for raising the voltage of the scanning signal of the Nth-stage scanning line;
   the bootstrap capacitor is connected at one end to the output terminal of the pull-up control module, and the other end of the bootstrap capacitor is inputted with the scanning signal of the Nth-stage scanning line.

14. The circuit according to claim 7, wherein, the circuit further comprises:
   a pull-down module for pulling down the scan level signal of the Nth-stage scanning line based on the cascade signal of the lower level;
   a pull-down holding module for holding a low level of the scan level signal of the Nth-stage scanning line;
   a constant voltage source for providing a pull-down low level.

15. A display device, wherein, the display device comprises a driving circuit as set forth in claim 1.

* * * * *